United States Patent
Oster

(10) Patent No.: US 7,719,255 B2
(45) Date of Patent: May 18, 2010

(54) SAFE INPUT CIRCUIT WITH ONE-CHANNEL PERIPHERAL CONNECTION FOR THE INPUT OF A BUS PARTICIPANT

(75) Inventor: Viktor Oster, Blomberg (DE)

(73) Assignee: Phoenix Contact GmbH & Co. KG (DE)

( * ) Notice: Subject to any disclaimer, the term of this patent is extended or adjusted under 35 U.S.C. 154(b) by 354 days.

(21) Appl. No.: 11/770,487

(22) Filed: Jun. 28, 2007

(65) Prior Publication Data
US 2008/0042639 A1 Feb. 21, 2008

(30) Foreign Application Priority Data
Jun. 28, 2006 (DE) ........................ 10 2006 030 114

(51) Int. Cl.
*G01R 19/00* (2006.01)
*G01R 31/28* (2006.01)
(52) U.S. Cl. .................. 324/76.11; 324/158.1
(58) Field of Classification Search .............. 324/76.11, 324/158.1
See application file for complete search history.

(56) References Cited

U.S. PATENT DOCUMENTS

| | | | | |
|---|---|---|---|---|
| 6,150,846 | A * | 11/2000 | Sakamoto | 326/86 |
| 6,404,609 | B1 * | 6/2002 | Mansfield et al. | 361/103 |
| 2004/0199837 | A1 * | 10/2004 | Meyer-Grafe et al. | 714/712 |
| 2004/0215354 | A1 * | 10/2004 | Nakamura et al. | 700/21 |

FOREIGN PATENT DOCUMENTS

| | | |
|---|---|---|
| DE | 39 27 518 C2 | 1/1994 |
| DE | 199 06 932 A1 | 8/2000 |
| EP | 0 393 282 A2 | 10/1990 |
| GB | 2 136 233 A | 9/1984 |
| JP | 01237702 | 9/1989 |
| JP | 03004308 | 10/1991 |
| JP | 04244778 | 9/1992 |

OTHER PUBLICATIONS

Dipl.-Phys. Seibert, "DE Application No. 10 2006 030 114.5-31 Office Action", Jun. 24, 2009, Publisher: Deutsches Patent- und Markenamt, Published in: DE.
Texas Instruments, "TL431, TL431A Adjustable Precision Shunt Regulators", XP-002453098, Texas Instruments Incorporated, Published SLVS005M—Jul. 1978—Revised Oct. 2000.

* cited by examiner

*Primary Examiner*—Amy He
(74) *Attorney, Agent, or Firm*—DeMont & Breyer, LLC

(57) ABSTRACT

An input circuit for an input component is disclosed for enabling the safe reading of input signals applied to the input component. The disclosed input circuit for an input component, particularly a bus input component, enables the safe reading of input signals applied to the input component, particularly according to the standards Category 4 DIN EN 954 and SIL 3 IEC 61508, which is characterized by at least one signal input circuit with a one-channel periphery connection for the connection of at least one signal generator, an evaluation circuit, which can be connected electrically to the signal input circuit via a first coupling element, and a comparison circuit, which is connected electrically to the signal input circuit, for setting a reference voltage for the activation and deactivation of the coupling element.

17 Claims, 1 Drawing Sheet

SAFE INPUT CIRCUIT WITH ONE-CHANNEL PERIPHERAL CONNECTION FOR THE INPUT OF A BUS PARTICIPANT

FIELD OF THE INVENTION

The invention relates to an input circuit for an input component, particularly a bus input component, for safe reading of input signals applied to the input component.

BACKGROUND OF THE INVENTION

Reading data from a process environment, such as, for example, from a field, via input signals that are provided by appropriately arranged signal generators, that is particularly by switches [and] sensors, puts demands on the requirements for error recognition and the failure behavior of a circuit constructed for this purpose as well as of the periphery.

Particularly in the case of safety-relevant data in the field of safety technology, these requirements must meet, for example, the standards according to DIN EN 954-1 or according to IEC 61508. To satisfy such requirements, complex, conventionally two-channel, structures of the input circuit are required, which entails high cost for producing the circuit and for providing the circuits for the periphery, that is, particularly with respect to the wiring to the signal generator, for example, to a safety switch. Such circuits consequently have a very complex structure and as a result are also cost intensive. Due to the increased need for component elements, these circuits are additionally also disadvantageous with regard to their availability.

SUMMARY OF THE INVENTION

A problem addressed by the invention is to provide a circuit for reading safety-relevant signals, which is novel and substantially simpler compared to the state of the art.

An input circuit according to the invention for an input component, particularly a bus input component, for the safe reading of input signals applied to the input component, which input circuit satisfies particularly standards Category 4 DIN EN 954 and SIL 3 IEC 61508, is characterized by at least one signal input circuit with a one-channel periphery connection for connecting at least one signal generator, as well as by an evaluation circuit that can be connected electrically to the signal input circuit via a first coupling element, and by a comparison circuit that is electrically connected to the signal input circuit for setting a reference voltage for the activation and deactivation of the coupling element.

For the implementation of such an input circuit according to the invention, the invention thus proposes, furthermore, a comparison circuit for a signal input circuit of an input component, particularly a bus input component, with a one-channel periphery connection for connecting at least one signal generator, where the signal input circuit can be connected electrically to an evaluation circuit for reading input signals applied to the input component via a first coupling element, and where the comparison circuit, to allow a safe reading of the input signals, comprises means for setting a reference voltage for the activation and deactivation of the coupling element.

The invention thus allows, by means of the comparison circuit, the application-specific setting of a switching threshold between the signal input circuit and the evaluation circuit, so that the safety requirements according to category 4 DIN EN 954 and SIL 3 IEC 61508 can also be satisfied, where the signal input circuit is nevertheless designed with one channel for a safe input switching to the periphery, and can thus be constructed with few construction parts in a cost efficient manner and with substantially improved times between the occurrence of errors, so-called MTBF (mean time between failures) times and consequently increased availability.

To further increase the safety, it is preferred for the comparison circuit to comprise a reference voltage source and a circuit for testing the reference voltage source. As a result, the comparison circuit itself can be tested, and the switching threshold of the input signals required for the necessary safety can be ensured and verified in a simple manner.

To further increase the safety with regard to component failures, the test circuit, in a more advantageous variant, presents two voltage dividers that are constructed from three resistors and are connected to a reference diode, to allow the setting of the reference voltage.

Furthermore, it is advantageous for each of the voltage dividers to be connected to a respective second coupling element to allow the individual superposition, in each case, of a current flow. As a result, substantially all the critical components of the comparison circuit and of the signal input circuit as well as the coupling element can be tested.

It is advantageous, in the practical implementation, to connect the reference diode to a supply voltage where, to limit the supply voltage for the reference diode, a resistor is arranged in the conductor between the reference diode and the supply voltage, and a Z diode is connected in parallel to the reference diode.

The input circuit advantageously comprises a Z diode that is connected in the signal input circuit to limit the input voltage, which is based on an applied input signal, to a maximum value. The subsequent components can thus be designed overall for lower voltages.

Furthermore, to ensure the ability to test the coupling element arranged between the signal input circuit and the evaluation circuit independently of the comparison circuit, which further increases the safety, a variant of the input circuit according to the invention comprises furthermore a test circuit that is electrically connected to the signal input circuit for testing the first coupling element.

In a particularly simple manner, the test circuit preferably presents, for the purpose of testing the first coupling element, a third coupling element through which a test voltage can be applied to the first coupling element in the signal input circuit.

To ensure the decoupling of different voltage ranges, in a preferred embodiment, at least the first coupling element is an optocoupler, and, particularly advantageously, all the coupling elements are optocouplers.

The safety is further increased if the evaluation circuit is constructed with two channels.

Furthermore, it is advantageous for redundant signal generators to be series connectable to the signal input circuit. Because the signal input circuit for the redundant channel is thus completely omitted, improvement of the availability and a further reduction of the wiring cost are achieved because, as a result, only one clamp continues to be needed even in the case of the use of redundant signal generators, such as, for example, safety switches.

An additional advantage is that a plurality of signal input circuits can be connected in parallel to the comparison circuit because one comparison circuit is thus sufficient for a plurality of input circuits.

Thus, it is preferred for the circuit according to the invention to be used in safety technology for reading safety-relevant sensor signals and/or to be integrated in a bus input component, which is part of a master, a safe control and/or a field unit. The circuit here guarantees a one-channel construction in the periphery area leading to a two-channel evaluation in the logic area, which results in a clear reduction of the manufacturing costs and the foot print. Furthermore, the complete circuit can be essentially tested with simple means, and the switching thresholds can be tested 100%. This circuit can be used not only for the acquisition of safe signals, but also for the acquisition of standard signals, particularly if the requirements are stringent.

BRIEF DESCRIPTION OF THE DRAWINGS

The invention is described in further detail below with the help of a preferred embodiment in reference to the attached drawing, in which.

DETAILED DESCRIPTION

Figure 1:
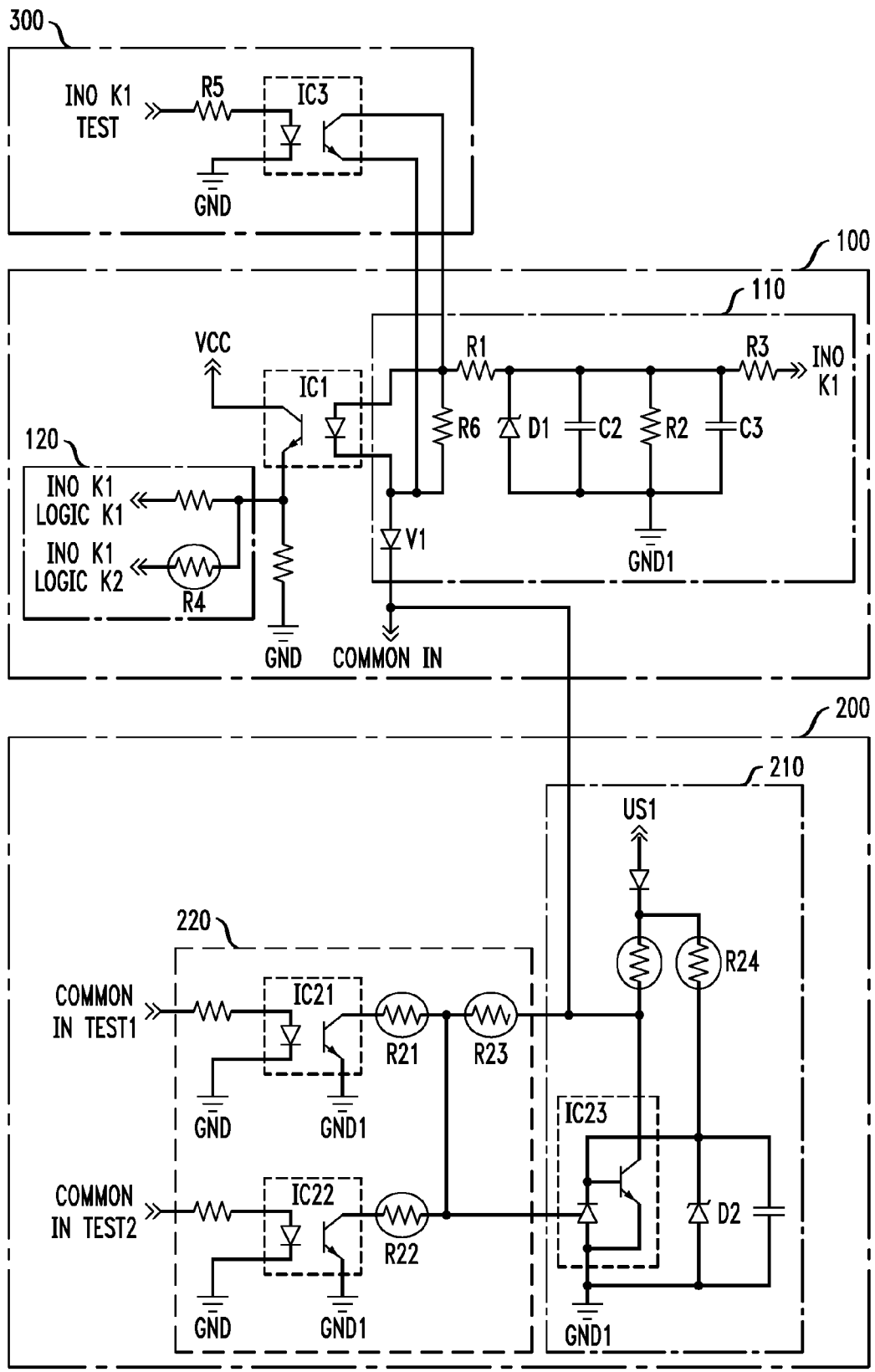
FIG. 1 represents an exemplary structure of a safe input circuit according to the invention.

The input circuit according to the invention according to FIG. 1 comprises an input circuit 100, which is essentially constructed from a signal input circuit 110 and an evaluation circuit 120 that can be connected electrically to the signal input circuit 110 via a coupling element IC1. The signal input circuit has a one-channel periphery connection "INO K1" for connecting at least one signal generator, such as, for example, a sensor or switch. Furthermore, the input circuit comprises a comparison circuit 200 with a testable reference voltage source 210 and is connected electrically with the signal input circuit 100, and a test circuit 300 for the coupling element IC1.

The connection between the comparison circuit 200 and the input circuit 100 is carried out via the signal input circuit 110 at a connection point marked "COMMON IN," at which, through the comparison circuit 200, a reference voltage can be set for the activation or deactivation of the coupling element IC1.

Because additional input circuits can be connected via the common connection point "COMMON IN," a first essential characteristic of the input circuit according to the invention thus is that the comparison circuit 200 needs to be present only once, including for the operation of several input circuits. Because such additional input circuits are constructed advantageously according to the input circuit 100, the following description is limited to the embodiment represented in FIG. 1 and is thus applicable to such additional input circuits.

For the galvanic separation of the evaluation circuit 120 from the signal input circuit 110, the coupling element IC1 is an optocoupler, and the resistor R1 is connected before the optocoupler on the primary side for current limitation. The represented signal input circuit 110 presents, for example, a voltage divider, constructed from the resistors R2 and R3, for an input signal that is applied to the input of the periphery connection "INO K1," as well as two capacitors C2 and C3 for compensating for parasitic effects. It should be noted, in this regard, that another circuit like the one represented can in principle also be included.

Furthermore, the signal input circuit 110 includes a Z diode D1 for the final limitation of a high state input voltage applied to the input of the periphery connection "INO K1" at a predetermined maximum high state input voltage value, as well as a diode V1, which is connected after the optocoupler IC1 on the primary side and is intended to protect the optocoupler against negative voltage.

The secondary side of the optocoupler IC1 is connected to a supply voltage VCC and to the evaluation circuit 120. In the example according to FIG. 1, the evaluation circuit 120, for the additional logic area that is not represented, is divided into two channels "INO K1 Logic K1" and "INO K1 LOGIC K2," so that the input signals, which are applied with one channel, can also be processed using two channels in the logic area, which increases the safety with regard to the evaluation, but does not have to be necessarily required in a specific application. The resistor that is assigned to the channel "INO K1 LOGIC K2," is here represented as a coiled resistor, so that a decoupling of the two channels against overvoltage and thus back-coupling freedom is ensured.

The comparison circuit 200 represented according to FIG. 1 comprises a test circuit 220, which presents two voltage dividers constructed from three resistors R21, R22, R23, and which is connected to the reference diode IC23 of a reference voltage source 210. A resistor R24, which is arranged in the conductor between the reference diode IC23 and a supply voltage US1, and a Z diode D2, which is connected in parallel to the reference diode, limit the supply voltage US1 for the reference diode IC23 to a predetermined value. The resistors R21, R22, R23, and R24 are also represented as coiled resistors.

By means of the voltage dividers R23 and R21 or R23 and R22 at the reference diode IC23 plus the forward bias of the diode V1 and of the optocoupler IC1, a lower switching threshold of the input voltage is set by means of a reference voltage applied to the connection point "COMMON IN." As a result, it is ensured that the input can be recognized as set only after an input voltage has been reached that is greater than the predetermined switching threshold voltage.

The test circuit 300 represented in FIG. 1 and provided for testing the optocoupler IC1 comprises an optocoupler IC3 through which a test voltage can be applied to the optocoupler IC1. A test for checking the functional capacity of the optocoupler IC1 is advantageously carried out if an input signal applied to "INO K1" is in the high state or changes from the low state to the high state, the high state input voltage value thus is/becomes greater than the switching threshold voltage, and the evaluation circuit 120 consequently recognizes the input during normal operation as set. If a test signal "INO K1 TEST" is applied to the optocoupler IC3, the optocoupler IC1 is bridged according to the wiring represented in FIG. 1, and a test voltage is applied to the optocoupler IC1 by using appropriate dimensions for the resistors R5 and R6, respectively, which are connected before and after the optocoupler IC3, at which voltage the evaluation circuit 120 recognizes the input as not set in the case of error-free operation.

Furthermore, in the comparison circuit 200, the resistors R23, R21 and R22 are particularly of special importance. Because the minimum input switching threshold is to be ensured through them, the input circuit is preferably constructed with redundancy at this location to increase the safety. Each of the voltage dividers consisting of R23 and R21 or R23 and R22 is connected via an optocoupler IC21 or IC22 for the corresponding individual superposition of a current flow, to a conductor path marked "COMMON IN TEST1" or "COMMON IN TEST2." As a result of the redundant design, the voltage dividers R23 and R21, or R23 and R22, the optocoupler IC21, IC22 as well as the reference diode IC23 can moreover be tested completely. The optocoupler IC1 as well is testable.

Below, different states of the comparison circuit 200 and corresponding error detections during the performance of tests are described.

The tests are advantageously also carried out if the input signal applied to "INO K1" is in the high state; the high state input voltage value is thus greater than the switching threshold voltage, and the evaluation circuit 120 consequently recognizes the input as set during normal operation.

The two voltage dividers R23 and R21, and R23 and R22, respectively, are connected consecutively, and the results on the logic side, i.e., the signals of the channels "INO K1 Logic K1" and "INO K1 Logic K2" of the evaluation circuit 120, are compared.

In case of error-free operation, the predetermined switching threshold of the input circuit is then correctly set for the acquisition of the input in the high state, which is connected to the input clamp or the peripheral connection INO if only one of the two optocouplers IC21 and IC22 is set.

Then, the two optocouplers IC21 and IC22 are set, which results in raising the reference voltage at the connection point "COMMON IN" in case of error-free operation to a predetermined value above the maximum high state input voltage value, which is predetermined by the Z diode D1. Because the input voltage is thus limited by the Z diode D1 to a value below the switching threshold voltage, current no longer flows through the optocoupler IC1. In this state then, if no error is present, the logic signals of the channels "INO K1 Logic K1" and "INO K1 Logic K2" of the evaluation circuit are in the low state.

If the Z diode D1 limits, for example, the maximum high state input voltage value to 8.2 V, and, if only one of the optocouplers IC21 and IC22 is used, the set voltage is applied to the connection point "COMMON IN" at 4.85 V, then, if an input is in the high state, current flows through the optocoupler IC1 with error-free operation, and the evaluation circuit 120 recognizes the input as set. The two possible states, namely when only one of the optocouplers IC21 and IC22 is set, are used furthermore to check the resistors R23, R21 and R22 and the optocouplers IC21 and IC22 by alternately controlling the optocouplers IC21 and IC22. If both optocouplers IC21 and IC22 are set, then the set voltage in the connection point "COMMON IN" is 8.47 V, for example. This state is consequently also used particularly to check the Z diode D1 and the back-coupling of the input.

Thus, with the input circuit according to the invention, the optocoupler IC1 and the input circuit 100 are tested overall with two different processes, and, at the same time, the comparison circuit 200 is tested, and substantially all critical errors are detected; here the safe state of the circuit is the low state.

The input circuit of the invention according to FIG. 1 thus offers a possibility, which can be implemented in a simple manner, to transfer with one channel the input data of an input circuit, which data are applied to the periphery connection "INO K1," to two channels for evaluation. Although the circuit in the periphery area may thus be implemented with only one channel, it meets the requirements for two-channel systems according to DIN EN 61508 and DIN EN 954. Consequently, it requires only one connection clamp for the connection of external sensors, such as, for example, safety switches, which reduces the wiring cost, where redundant switches/sensors, if needed, can be series connected, which again substantially reduces the wiring cost. The circuit according to the invention is thus suitable preferably for the acquisition of safety-relevant signals in an input component and it is, furthermore, preferably integrated within an input component, which is not represented in greater detail, particularly a bus input component, which, for example, can also be part of a master, a safe control and/or a field unit. However, the circuit according to the invention can be used furthermore for the acquisition of standard signals, particularly if the requirements are stringent.

The invention claimed is:

1. Input circuit for an input component for the safe reading of input signals applied to the input component, the input circuit comprising:
    a signal input circuit (110) with a one-channel periphery connection (INO) for the connection of at least one signal generator;
    an evaluation circuit (120), which is connected electrically to the signal input circuit (110) via a first coupling element (IC1);
    a comparison circuit (200), which is electrically connected to the signal input circuit (110), for setting a reference voltage for the activation or deactivation of the coupling element (IC1); and
    a test circuit (300), which is connected electrically to the signal input circuit, for testing the first coupling element (IC1),
    wherein the test circuit (300) for testing the first coupling element (IC1) presents a third coupling element (IC3), through which a test voltage can be applied to the first coupling element in the signal input circuit.

2. Input circuit according to claim 1, characterized in that the comparison circuit (200) comprises a reference voltage source (210) and a circuit (220) for testing the reference voltage source.

3. Input circuit according to claim 2, characterized furthermore in that the test circuit (220) presents two voltage dividers, which are constructed from three resistors (R21, R22, R23) and connected to a reference diode (IC23), for setting the reference voltage.

4. Input circuit according to claim 3, characterized furthermore in that each of the voltage dividers (R23, R21; R23, R22) is connected to a corresponding second coupling element (IC21, IC22), in each case for the individual superposition of a current flow.

5. Input circuit according to claim 3, characterized furthermore in that the reference diode (IC23) is connected to a supply voltage (US1), and, for the limitation of the supply voltage, a resistor (R24) is provided in the conductor between the reference diode and the supply voltage, and a Z diode (D2) is connected parallel to the reference diode.

6. Input circuit according to claim 1, further comprising a Z diode (D1), which is connected in the signal input circuit, and is intended to limit the input voltage, which is based on an applied input signal, to a maximum value.

7. Input circuit according to claim 1, characterized furthermore in that at least the first coupling element (IC1) is an optocoupler.

8. Input circuit according to claim 1, characterized furthermore in that the evaluation circuit (120) is constructed with two channels.

9. Input circuit according to claim 1, characterized in that redundant signal generators can be series connected to the signal input circuit.

10. Input circuit according to claim 1, characterized furthermore in that a plurality of signal input circuits can be parallel connected to the comparison circuit.

11. Input circuit according to claim 1, characterized furthermore in that the input component is a bus input component.

12. Input component comprising an input circuit according to claim 1.

13. Input component according to claim 12, which forms a part of a master, a safe control or a field unit.

14. Input component according to claim 12, characterized furthermore in that the input component is a bus component.

15. A method for enabling safety technology comprising utilizing the input circuit according to claim 1.

16. Comparison circuit for a signal input circuit of an input component with a one-channel periphery connection for the connection of at least one signal generator, where the signal input circuit (110) for reading input signals applied to the input component is connected electrically to an evaluation circuit (120) via a first coupling element (IC1), the comparison circuit comprising:

- a reference voltage source comprising a reference diode, wherein the reference voltage source is for providing a reference voltage for the activation and deactivation of the first coupling element; and
- a test circuit for testing the reference voltage source and comprising two voltage dividers, which are constructed from three resistors and are connected to the reference diode, for setting the reference voltage;
- wherein each of the voltage dividers is connected to a corresponding second coupling element for the corresponding individual superposition of a current flow.

17. Comparison circuit according to claim 16, characterized furthermore in that the input component is a bus input component.

* * * * *